US012451664B2

(12) United States Patent
Miura et al.

(10) Patent No.: US 12,451,664 B2
(45) Date of Patent: Oct. 21, 2025

(54) LIGHT-RECEIVING ELEMENT AND LIGHT-EMITTING DEVICE

(71) Applicant: NICHIA CORPORATION, Anan (JP)

(72) Inventors: Soichiro Miura, Tokushima (JP); Yoshiharu Nagae, Tokushima (JP); Kiyoshi Enomoto, Komatsushima (JP); Shota Murakami, Anan (JP)

(73) Assignee: NICHIA CORPORATION, Anan (JP)

( * ) Notice: Subject to any disclaimer, the term of this patent is extended or adjusted under 35 U.S.C. 154(b) by 706 days.

(21) Appl. No.: 17/787,199

(22) PCT Filed: Dec. 9, 2020

(86) PCT No.: PCT/JP2020/045876
§ 371 (c)(1),
(2) Date: Jun. 17, 2022

(87) PCT Pub. No.: WO2021/125017
PCT Pub. Date: Jun. 24, 2021

(65) Prior Publication Data
US 2023/0012665 A1 Jan. 19, 2023

(30) Foreign Application Priority Data
Dec. 20, 2019 (JP) ................. 2019-230258

(51) Int. Cl.
H01S 5/40 (2006.01)
H01L 23/00 (2006.01)
(Continued)

(52) U.S. Cl.
CPC .......... *H01S 5/02325* (2021.01); *H01L 24/48* (2013.01); *H01S 5/02208* (2013.01);
(Continued)

(58) Field of Classification Search
CPC ..... H01S 5/4031; H01S 5/4075; H01S 5/0262
See application file for complete search history.

(56) References Cited

U.S. PATENT DOCUMENTS 4,293,826 A 10/1981 Scifres et al.
4,297,653 A 10/1981 Scifres et al.
(Continued)

FOREIGN PATENT DOCUMENTS

EP 0 836 105 A1 4/1998
JP S55-145386 A 11/1980
(Continued)

OTHER PUBLICATIONS

International Search Report with English translation and Written Opinion issued in the corresponding PCT Application No. PCT/JP2020/045876, dated Feb. 16, 2021; 8 pages.

*Primary Examiner* — Michael Carter
(74) *Attorney, Agent, or Firm* — Foley & Lardner LLP

(57) ABSTRACT

A light detecting element is realized in which a length thereof is reduced in a direction perpendicular to a direction in which light detecting regions are disposed side by side. A light detecting element includes a light detecting surface provided with a plurality of light detecting regions disposed side by side in a first direction and a plurality of wiring regions electrically connected to the plurality of light detecting regions. Of the plurality of wiring regions, a plurality of the wiring regions connected to a plurality of the light detecting regions are provided in an end region that is a region excluding a central region at the light detecting surface.

18 Claims, 5 Drawing Sheets

(51) Int. Cl.
- *H01S 5/02208* (2021.01)
- *H01S 5/02255* (2021.01)
- *H01S 5/02315* (2021.01)
- *H01S 5/02325* (2021.01)
- *H01S 5/026* (2006.01)
- *H01S 5/0683* (2006.01)

(52) U.S. Cl.
CPC ...... *H01S 5/02255* (2021.01); *H01S 5/02315* (2021.01); *H01S 5/0262* (2013.01); *H01S 5/0683* (2013.01); *H01S 5/4031* (2013.01); *H01S 5/4075* (2013.01); *H01L 2224/48227* (2013.01); *H01L 2924/12035* (2013.01); *H01L 2924/12042* (2013.01); *H01L 2924/12043* (2013.01)

(56) References Cited

U.S. PATENT DOCUMENTS

| | | | |
|---|---|---|---|
| 6,587,495 B2 * | 7/2003 | Kimizuka | H01S 5/0264 372/50.1 |
| 2002/0136256 A1 | 9/2002 | Hamasaki et al. | |
| 2003/0085341 A1 * | 5/2003 | Komiyama | H10F 39/802 250/214.1 |
| 2005/0194654 A1 | 9/2005 | Iguchi | |
| 2007/0268387 A1 | 11/2007 | Koyama | |
| 2012/0037787 A1 | 2/2012 | Kitada et al. | |
| 2012/0250711 A1 * | 10/2012 | Makino | H01S 5/0265 359/245 |
| 2013/0001651 A1 | 1/2013 | Mase et al. | |
| 2015/0333095 A1 | 11/2015 | Fallica et al. | |

FOREIGN PATENT DOCUMENTS

| | | |
|---|---|---|
| JP | S55-145387 A | 11/1980 |
| JP | H04-090657 A | 3/1992 |
| JP | H04-206046 A | 7/1992 |
| JP | H06-010699 Y | 3/1994 |
| JP | H06-342900 A | 12/1994 |
| JP | H10-173207 A | 6/1998 |
| JP | 2000-323743 A | 11/2000 |
| JP | 2001-291877 A | 10/2001 |
| JP | 2001-352094 A | 12/2001 |
| JP | 2001352094 * | 12/2001 |
| JP | 2002-118281 A | 4/2002 |
| JP | 2002-252415 A | 9/2002 |
| JP | 2002-270938 A | 9/2002 |
| JP | 2003-222765 A | 8/2003 |
| JP | 2003-249687 A | 9/2003 |
| JP | 2004-273747 A | 9/2004 |
| JP | 2005-251890 A | 9/2005 |
| JP | 2007-311664 A | 11/2007 |
| JP | 2008-072589 A | 3/2008 |
| JP | 2011-222893 A | 11/2011 |
| JP | 2012-209286 A | 10/2012 |

* cited by examiner

LIGHT-RECEIVING ELEMENT AND LIGHT-EMITTING DEVICE

TECHNICAL FIELD

The present invention relates to a light detecting element and a light emitting device.

BACKGROUND ART

In related art, an optical unit is known that causes a light detecting element to receive a portion of light emitted from a light emitting element and performs optical control based on a light reception result. Further, Patent Document 1 discloses a light detecting element in which three light receiving parts are disposed side by side and a metal electrode is provided for each of the light receiving parts.

CITATION LIST

Patent Documents

Patent Document 1: JP 2007-311664 A

SUMMARY OF INVENTION

Technical Problem

When a plurality of light detecting regions are provided in a light detecting element, there is room for improvement in an arrangement relationship between the plurality of light detecting regions and a wiring region for the plurality of light detecting regions.

Solution to Problem

A light detecting element according to an aspect of the present disclosure includes a light detecting surface including a plurality of light detecting regions disposed side by side in a first direction and a plurality of wiring regions electrically connected to the plurality of light detecting regions. Of a plurality of wiring regions, a plurality of wiring regions, electrically connected to two of the light detecting regions disposed adjacent to each other, are provided in an end region that is a region excluding a central region at the light detecting surface. The central region includes a region sandwiched between a straight line extending in a second direction perpendicular to the first direction and passing through a midpoint of a width, in the first direction, of the light detecting region disposed at one end, of the light detecting regions disposed at both ends, and a straight line extending in the second direction and passing through a midpoint of a width, in the first direction, of the light detecting region disposed at another end.

Further, a light detecting element according to an aspect of the present disclosure includes a light detecting surface including a plurality of light detecting regions disposed side by side in a first direction and a plurality of wiring regions electrically connected to the plurality of light detecting regions. Of the plurality of wiring regions, a plurality of wiring regions electrically connected to two of the light detecting regions disposed at both ends are provided in an end region excluding a central region, and not provided in the central region, the end region being a region excluding the central region, at the light detecting surface. The central region at the light detecting surface includes a region sandwiched between a straight line extending in a second direction perpendicular to the first direction and passing through an end point, of the light detecting region disposed at one end of the light detecting regions disposed at both ends, located farthest from the light detecting region at another end, and a straight line extending in the second direction and passing through an end point, of the light detecting region disposed at the other end, located farthest from the light detecting region at the one end.

A light emitting device according to an aspect of the present disclosure includes a plurality of light emitting elements disposed side by side in a first direction, each having an upper surface, a lower surface, and a lateral surface including an emission end surface from which light is emitted, a light detecting element including a light detecting surface including a plurality of light detecting regions disposed side by side in the first direction and irradiated with the light emitted from the plurality of light emitting elements, and a plurality of first wiring regions, a base member including a plurality of second wiring regions and at which the plurality of light emitting elements and the light detecting element are disposed, and a plurality of wires, one ends of both ends of which are bonded to one of the plurality of first wiring regions, and another ends of the both ends of which are bonded respectively to ones of the plurality of second wiring regions. The plurality of first wiring regions are provided in an end region that is a region excluding a central region at the light detecting surface. In a top view, the central region includes, at the light detecting surface, a region sandwiched between a straight line extending in a second direction perpendicular to the first direction and passing through an irradiation point of light passing through an optical axis of light with which the light detecting region disposed at one end of the light detecting regions disposed at both ends is irradiated, and a straight line extending in the second direction and passing through an irradiation point of light passing through an optical axis of light with which the light detecting region disposed at another end of the both ends is irradiated.

Advantageous Effects of Invention

According to the present invention, a light detecting element can be realized in which a length thereof is reduced in a direction perpendicular to a direction in which light detecting regions are disposed side by side. Further, by using this light detecting element, a light emitting device with a reduced height can be realized.

DESCRIPTION OF EMBODIMENTS

Figure 1:
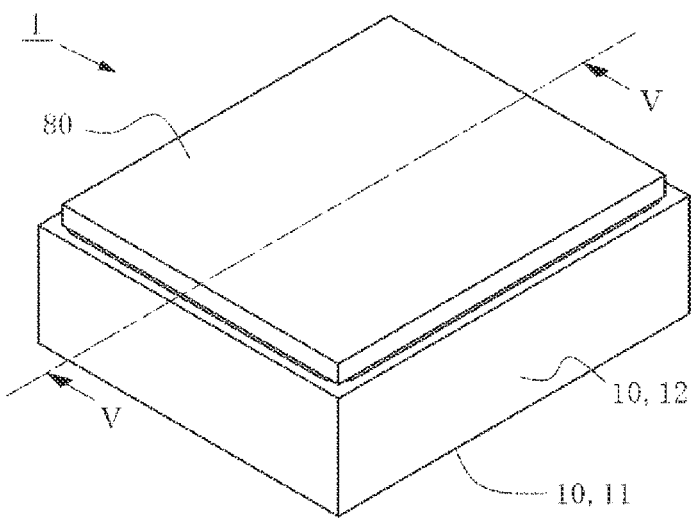
FIG. 1 is a perspective view of a light emitting device according to a first embodiment.

In this specification or the scope of the claims, polygons such as triangles and quadrangles, including shapes in which the corners of the polygon are rounded, chamfered, beveled, coved, or the like, are referred to as polygons. Further, a shape obtained by processing not only the corners (ends of sides), but also an intermediate portion of a side is similarly referred to as a polygon. That is, a shape that is partially processed while remaining based on a polygon is included in the interpretation of "polygon" described in this specification and the scope of the claims.

The same applies not only to polygons but also to words representing specific shapes such as trapezoids, circles, protrusions, and recessions. Further, the same applies in the treatment of each side forming that shape. That is, even if processing is performed on a corner or an intermediate portion of a certain side, the interpretation of "side" includes the processed portion. Note that when a "polygon" or "side" not partially processed is to be distinguished from a processed shape, "strict" will be added to the description as in, for example, "strict quadrangle".

Further, in this specification or the scope of the claims, when there are a plurality of components corresponding to a certain component and each of the components is to be expressed separately, the components may be distinguished by adding the terms first and second in front of the component term. Further, when an object or viewpoint is different as distinguished between the present specification and the scope of the claims, there may be a case in which the same terms do not refer to the same objects in the present specification and in the scope of the claims.

For example, in this specification, there are objects distinguished by being termed first, second, and third. However, when the scope of the claims is described for the first and third objects of the specification only, the objects termed first and second in the scope of the claims may refer to the objects termed first and third in the specification.

Embodiments for carrying out the present invention are described below with reference to the drawings. However, the illustrated embodiments are for embodying the technical concept of the present invention, and are not intended to limit the present invention. Further, in the descriptions below, the same term or reference numeral represents the same member or a similar member, and duplicate descriptions will be omitted as appropriate. Note that sizes, positional relationships, and the like of members illustrated in the drawings may sometimes be exaggerated in order to facilitate understanding.

First Embodiment

Figure 2:
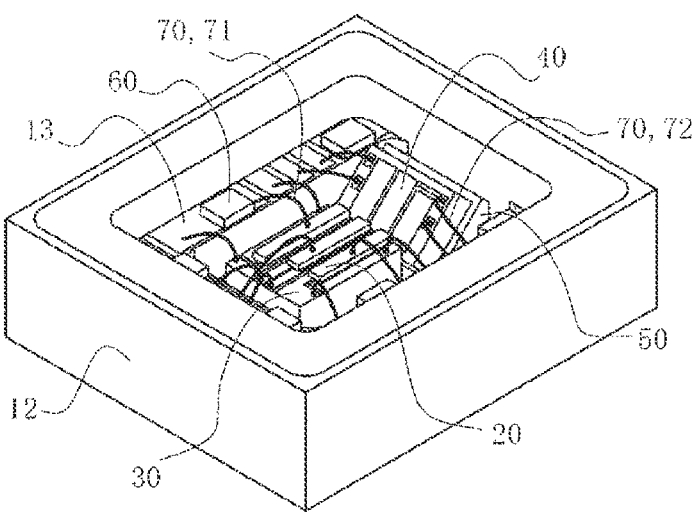
FIG. 2 is a perspective view of the light emitting device according to the first embodiment, in a state in which a lid member is removed.
Figure 3:
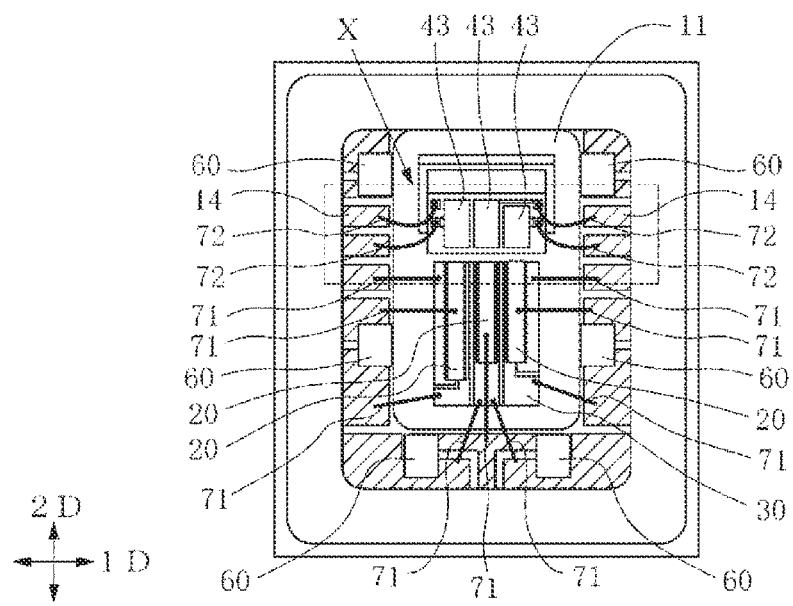
FIG. 3 is a top view of the light emitting device according to the first embodiment, in the state in which the lid member is removed.
Figure 4:
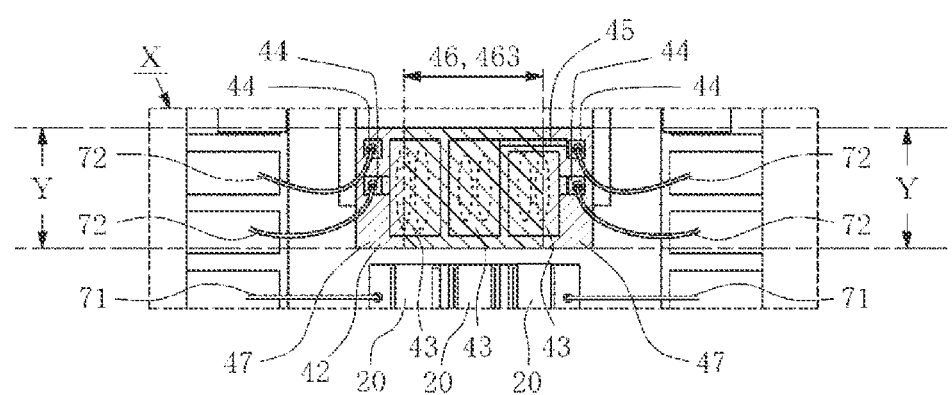
FIG. 4 is an enlarged view of a portion X in the top view of FIG. 3.
Figure 5:
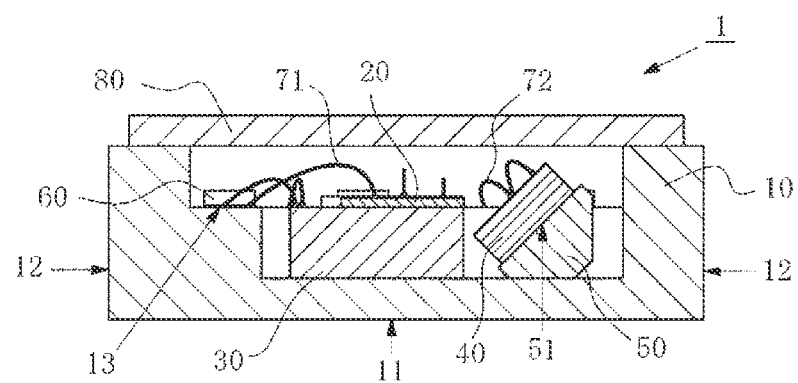
FIG. 5 is a cross-sectional view of the light emitting device taken along a line V-V in FIG. 1.
Figure 6:
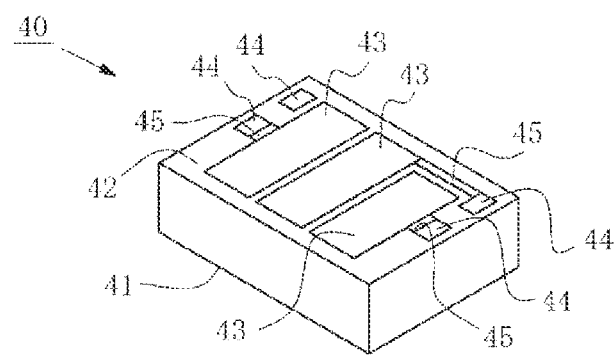
FIG. 6 is a perspective view of a light detecting element according to the embodiments.
Figure 7:
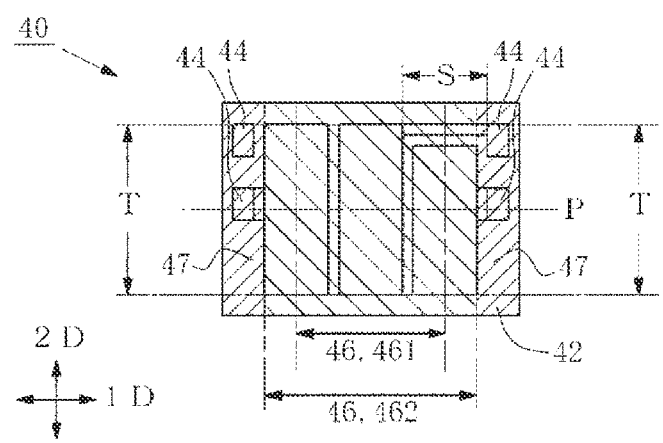
FIG. 7 is a top view of the light detecting element according to the embodiments.

A light emitting device 1 according to a first embodiment will be described. FIGS. 1 to 7 are drawings for explaining an exemplary form of the light emitting device 1. FIG. 1 is a perspective view of the light emitting device 1. FIG. 2 is a perspective view of the light emitting device 1, in a state in which a lid member 80 is removed. FIG. 3 is a top view of the same state as illustrated in FIG. 2. FIG. 4 is an enlarged view of a portion X of a light detecting surface 42 of a light detecting element 40 in the top view of FIG. 3. FIG. 5 is a cross-sectional view taken along a line V-V in FIG. 1. FIG. 6 is a perspective view of the light detecting element 40. FIG. 7 is a top view of the light detecting element 40.

Note that in the top view of FIG. 3, wiring regions 14, which are provided at a stepped portion 13 of a base member 10, are indicated by hatching. Dashed lines indicating the portion X are imaginary lines. In the enlarged view of FIG. 4, elliptical regions each depicted by a dotted line on the light detecting surface 42 indicate regions irradiated with light. In the enlarged view of FIG. 4, an example of a third central region 463 is indicated by hatching having a wide width, and an end region 47 based on this third central region 463 is indicated by hatching having a narrower width. Alternate long and short dash lines, which are supplementally depicted for indicating the third central region 463 and a width Y, are imaginary lines. In FIG. 7, the second central region 462 is indicated by hatching having a wide width, and the end region 47 based on the second central region 462 is indicated by hatching having a narrow width. Further, alternate long and short dash lines, which are supplementally depicted for indicating a first central region 461, the second central region 462, a width S, a width T, and a median line P are imaginary lines.

The light emitting device 1 has a plurality of components including the base member 10, a semiconductor laser element 20, a submount 30, the light detecting element 40, a support base 50, a protective element 60, a plurality of wires 70, and the lid member 80 (see FIG. 5 in particular for the support base 50).

In an illustrated example of the light emitting device 1, three of the semiconductor laser elements 20, the submount 30, the light detecting element 40, the support base 50, and the plurality of wires 70 are disposed in a space surrounded by the base member 10 and the lid member 80. Further, light emitted from the three semiconductor laser elements 20 disposed in the space is emitted to the outside of the light emitting device 1.

First, each of the components will be described.

Base Member 10

The base member 10 includes an arrangement region in which the other components are disposed, and a side wall surrounding the arrangement region. Further, the base member 10 includes a recessed portion, and the recessed portion is constituted by the arrangement region and the side wall. The recessed portion is recessed in a direction from an upper surface toward a lower surface of the base member 10. Here, a surface of the recessed portion, which forms the bottom of the recess, is referred to as a bottom surface. The bottom surface may be a main portion of the arrangement region.

In a top view, the outer shape of the base member 10 is rectangular. In a top view, the outer shape of the recess of the recessed portion is rectangular. Further, in a top view, the outer shape of the bottom surface of the base member 10 is rectangular. The outer shape of the bottom surface is smaller than the outer shape of the recess. Note that each of those outer shapes need not necessarily be rectangular.

The base member 10 includes a bottom surface portion 11 and a lateral surface portion 12. The bottom surface portion 11 is a portion that constitutes the bottom surface of the base member 10. Further, the bottom surface portion 11 includes the bottom surface and the lower surface of the base member 10. The lateral surface portion 12 is a portion that constitutes the side wall of the base member 10. Thus, the lateral surface portion 12 surrounds the bottom surface of the base member 10, and extends upward from the bottom surface. The lateral surface portion 12 includes one or more outer surfaces, one or more inner surfaces, and the upper surface, which intersects the outer surface and the inner surface, of the base member 10.

Here, the number of surfaces, namely, the number of inner surfaces or outer surfaces of the base member 10 depends on a shape surrounding the bottom surface. For example, if the shape surrounding the bottom surface is rectangular, inner surfaces corresponding to each of four sides of the rectangle are formed, so the number of inner surfaces is plural. For example, if the shape surrounding the bottom surface is circular, an inner surface corresponding to the one circle is formed, so the number of inner surfaces is one. The same also applies to the outer surface.

The base member 10 includes one or more stepped portions 13. The stepped portion 13 is formed at the recess of the base member 10. The stepped portion 13 refers to a portion constituted only by an upper surface and an inner surface intersecting this upper surface and extending downward. The stepped portion 13 is included in the lateral surface portion 12 of the base member 10. The stepped portion 13 is provided below the upper surface of the base member 10. Further, in a top view, the stepped portion 13 is formed between the outer shape of the recess of the base member 10 and the outer shape of the bottom surface.

The stepped portion 13 is formed along the inner surface intersecting the upper surface of the base member 10. Thus, the inner surface intersecting the upper surface of the base member 10 intersects the upper surface of the stepped portion 13. Further, the stepped portion 13 is formed along a portion of the inner surface(s) intersecting the upper surface of the base member 10. In other words, the stepped portion 13 is not provided along the entire perimeter of the inner surface(s) intersecting the upper surface of the base member 10. Note that the stepped portion 13 may be provided along the entire perimeter.

In the illustrated example of the light emitting device 1, in a top view, the outer shape of the inner surface intersecting the upper surface of the base member 10 is rectangular, and the stepped portion 13 is provided across three sides of the rectangle. Further, the stepped portion 13 is not provided at the remaining one side of the rectangle, except for sections thereof intersecting the other sides. Note that the number of sides along which the stepped portion 13 is provided need not necessarily be three.

The stepped portion 13 is preferably provided along 50% or more of the entire perimeter of the inner surface(s) intersecting the upper surface of the base member 10. In this way, a sufficient region for providing the wiring region can be secured in the stepped portion 13. Further, the stepped portion 13 is preferably provided along 90% or less of the entire perimeter of the inner surface(s) intersecting the upper surface of the base member 10. The stepped portion 13 is not provided in a region unsuitable for providing the wiring region, so the base member 10 can be designed to be small. Note that the stepped portion 13 may be provided along the entire perimeter.

One or more wiring regions 14 are provided at the upper surface of the stepped portion 13. In the illustrated example of the light emitting device 1, a plurality of the wiring regions 14 are provided. This wiring region 14 is electrically connected to a wiring region provided at the lower surface of the base member 10 via the interior of the base member 10. Note that the wiring region that is electrically connected to the wiring region 14 is not limited to being provided at the lower surface of the base member 10, and can be provided at an external surface (the upper surface, the outer surface, and the lower surface) of the base member 10.

The base member 10 can be formed from ceramic as the main material. Examples of the ceramic used for the base member 10 include aluminum nitride, silicon nitride, aluminum oxide, and silicon carbide.

The base member 10 can be formed by integrating the bottom surface portion 11 and the lateral surface portion 12. Further, the base member 10 may be formed by bonding the bottom surface portion 11 and the lateral surface portion 12, which are separately formed from different materials as the main materials thereof. In this case, for example, the bottom surface portion 11 and the lateral surface portion 12 can be formed from metal and ceramic, respectively, as the main materials thereof.

Further, in this case, the metal employed for the bottom surface portion 11 preferably has superior heat dissipating properties (has a higher thermal conductivity) than the ceramic employed for the lateral surface portion 12. Examples of the metal include copper, aluminum, and iron, and as composites, copper molybdenum, a copper-diamond composite material, and copper tungsten.

Metal films are provided at each of locations corresponding to the wiring region 14 of the base member 10 and the wiring region electrically connected to the wiring region 14. Metal is also provided at the interior of the base member 10 for electrical connection, thereby achieving the electrical connection.

Semiconductor Laser Element 20

The semiconductor laser element 20 has a rectangular outer shape in a top view. A lateral surface intersecting one of two short sides of the rectangle is an emission end surface of light emitted from the semiconductor laser element 20. An upper surface and a lower surface of the semiconductor laser element 20 have larger areas than the emission end surface, respectively.

The semiconductor laser element 20 is a multi-emitter including two or more emitters. Note that the semiconductor laser element 20 may be a single emitter including only one emitter. In the illustrated example of the light emitting device 1, the semiconductor laser element 20 includes two emitters. Further, one common electrode to the two emitters is provided at one of the upper surface and the lower surface of the semiconductor laser element 20, and two electrodes corresponding to the two emitters, respectively, are provided at the other of the upper surface and the lower surface.

Light (laser beam) emitted from the emitter of the semiconductor laser element 20 spreads and forms a far field pattern (hereinafter referred to as "FFP") of an elliptical shape in a plane parallel to the emission end surface of the light. The FFP indicates a shape and a light intensity distribution of the emitted light at a position far from the emission end surface.

Light passing through the center of the elliptical shape of the FFP, in other words, light having a peak intensity in the light intensity distribution of the FFP is referred to as light traveling on an optical axis. Based on the light intensity distribution of the FFP, light having an intensity of $1/e^2$ or more with respect to a peak intensity value is referred to as a main portion of the light.

The shape of the FFP of the light emitted from the semiconductor laser element 20 is an elliptical shape in which the light in a layering direction perpendicular to a layer direction of a plurality of semiconductor layers including an active layer is longer than the light in the layer direction. Note that the layer direction is referred to as a horizontal direction of the FFP, and the layering direction is referred to as a vertical direction of the FFP.

Further, based on the light intensity distribution of the FFP, an angle corresponding to a full width at half maximum of the light intensity distribution is referred to as a spread angle of light of that semiconductor laser element. The spread angle of light in the vertical direction of the FFP is referred to as a vertical spread angle, and the spread angle of light in the horizontal direction of the FFP is referred to as a horizontal spread angle.

As the semiconductor laser element 20, for example, a semiconductor laser element that emits blue light, a semiconductor laser element that emits green light, a semiconductor laser element that emits red light, or the like can be employed. A semiconductor laser element that emits light other than blue, green, and red light may also be employed.

Blue light refers to light having an emission peak wavelength within a range from 420 nm to 494 nm. Green light refers to light having the emission peak wavelength within a range from 495 nm to 570 nm. Red light refers to light having the emission peak wavelength within a range from 605 nm to 750 nm.

Examples of the semiconductor laser element that emits blue light or the semiconductor laser element that emits green light include a semiconductor laser element including a nitride semiconductor. GaN, InGaN, and AlGaN, for example, can be used as the nitride semiconductor. Examples of the semiconductor laser element that emits red light include a semiconductor laser element including an InAlGaP-based, GaInP-based, GaAs-based, or AlGaAs-based semiconductor.

Submount 30

The submount 30 includes two bonding surfaces, and is formed in a cuboid shape. One of the bonding surfaces is provided on the opposite side from the other bonding surface. A distance between the two bonding surfaces is smaller than a distance between other facing surfaces. Note that the shape of the submount 30 need not necessarily be the cuboid shape. The submount 30 may be formed using, for example, silicon nitride, aluminum nitride, or silicon carbide. Further, a metal film for bonding is provided on the bonding surface.

Light Detecting Element 40

The light detecting element 40 includes a bonding surface 41 and the light detecting surface 42. The bonding surface 41 is on the opposite side from the light detecting surface 42. Note that the bonding surface 41 need not necessarily be provided on the opposite side from the light detecting surface 42. The light detecting element 40 has an upper surface, a lower surface, and one or more lateral surfaces. Here, a surface having the light detecting surface 42 is the upper surface. Note that the outer shape of the light detecting element 40 is a cuboid shape, but is not limited to the cuboid shape.

A plurality of light detecting regions 43 are provided at the light detecting surface 42. In an illustrated example of the light detecting element 40, three light detecting regions 43 are provided. Note that the number of light detecting regions 43 is not limited to three. The plurality of light detecting regions 43 are disposed side by side at a predetermined interval. Here, a direction in which the plurality of light detecting regions 43 are disposed side by side is also referred to as a first direction. An arrow direction 1D in FIG. 7 indicates the first direction in the illustrated example of the light detecting element 40.

The light detecting surface 42 has a rectangular outer shape. The light detecting surface 42 has a length in the first direction that is greater than a length in a second direction. The second direction is a direction perpendicular to the first direction in a top view. An arrow direction 2D in FIG. 7 indicates the second direction in the illustrated example of the light detecting element 40. Note that the length in the first direction may be the same as the length in the second direction. The length in the second direction may be greater than the length in the first direction.

The plurality of light detecting regions 43 are disposed side by side at a regular interval so as to be close to each other. In other words, the light detecting regions 43 are separated from each other and do not overlap each other. Note that the interval may not be regular. The interval between the adjacent light detecting regions 43 is smaller than the width, in the first direction, of one of the adjacent light detecting regions 43. In this way, an interval between light with which each of the light detecting regions 43 is irradiated can be narrowed.

Each of the light detecting regions 43 has a rectangular outer shape, and is formed at the light detecting surface 42. Note that the outer shape is not limited to the rectangular shape, and may be appropriately designed according to the shape of the irradiation light. In the illustrated example of the light detecting element 40, the outer shape of each of the light detecting regions 43 is formed in a rectangular shape having short sides and long sides. Of two sets of two facing sides, which form the rectangle, two facing sides of one of the sets (short sides in a case of the rectangle having short sides and long sides) are parallel to the first direction. Note that the term "parallel" used here allows a difference within ±5 degrees.

The light detecting region 43 is longer in the second direction than in the first direction. In the illustrated example of the light emitting device 1, all the light detecting regions 43 satisfy this condition. Note that the light detecting region 43 having the same length in the first direction and the second direction may be included. The light detecting region 43 that is longer in the first direction than in the second direction may be included.

At the light detecting surface 42, the plurality of light detecting regions 43 include two light detecting regions 43 having different lengths in the second direction. At least one of the light detecting regions 43 disposed at both ends has a shorter length in the second direction at the light detecting surface 42 than the light detecting region 43 disposed adjacent to that light detecting region 43. The lengths, in the second direction, of the light detecting regions 43 disposed at both ends are different.

By disposing the short light detecting region 43 side by side with the long light detecting region 43, a space is generated at the light detecting surface 42 due to the difference in length. By effectively utilizing this space, the light detecting element 40 can be downsized.

In the illustrated example of the light emitting element 40, three of the light detecting regions 43 are disposed side by side in the first direction. Of the light detecting regions 43 disposed at both ends, the length, in the second direction, of the light detecting region 43 disposed at one end is shorter than the length, in the second direction, of the other light detecting regions 43. Then, by providing a conductive region 45, which will be described below, in the space generated due to the difference in length, the downsizing of the light detecting element 40 is achieved.

Note that the lengths, in the second direction, of all the light detecting regions 43 may be the same. Both the light detecting regions 43 disposed at both ends may have shorter lengths in the second direction at the light detecting surface 42 than that of the light detecting region 43 disposed adjacent to those light detecting regions 43. The lengths, in the second direction, of the light detecting regions 43 disposed at both ends may be the same.

The plurality of light detecting regions 43 are disposed such that one end, of both ends thereof in the second direction, are aligned with each other. In other words, a straight line connecting end points of the one end of the both ends, in the second direction, of the respective light detecting regions 43 is parallel to the first direction. Note that the term "parallel" used here allows a difference within ±5 degrees.

Further, this plurality of light detecting regions 43 include two light detecting regions 43 disposed adjacent to each other. This plurality of light detecting regions 43 include two light detecting regions 43 disposed at both ends. This plurality of light detecting regions 43 include two light detecting regions 43 having different lengths in the second direction. This plurality of light detecting regions 43 may be all of the light detecting regions 43. Further, alignment of the one ends can contribute the downsizing of the light detecting element 40.

When the light detecting element 40 includes the two light detecting regions 43 having the different lengths in the second direction, alignment of the one end of the two light detecting regions 43 results in non-alignment of the other ends. At this time, a distance in the second direction between the other end of one of the two light detecting region 43 and the other end of the other of the two light detecting regions 43 is the same as a difference of the lengths, in the second direction, of the two light detecting regions 43.

Note that the light detecting element 40 may include a plurality of the light detecting regions 43 that are not aligned at both ends in the second direction, in other words, the light detecting element 40 may include a plurality of the light detecting regions 43 in which a straight line connecting ends of the plurality of light detecting regions 43 at either end in the second direction is not parallel to the first direction.

Here, when the two light detecting regions 43 having the different lengths in the second direction are provided, and when the two light detecting regions 43 are not aligned at either end, the light detecting region 43 having a shorter length in the second direction is sandwiched between a straight line parallel to the first direction and passing through an endpoint of the one end of the both ends, in the second direction, of the light detecting region 43 having a longer length, and a straight line parallel to the first direction and passing through an endpoint of the other end of the both ends, in the second direction, of the light detecting region 43 having the longer length. This configuration is preferable in terms of downsizing the light detecting element 40.

A plurality of wiring regions 44 are provided at the light detecting surface 42 of the light detecting element 40. Note that the number of wiring regions 44 is one or more. Further, the wiring region 44 may be provided not only at the light detecting surface 42, but also at a surface other than the light detecting surface 42. Each of the wiring regions is electrically connected to the light detecting region 43.

The plurality of wiring regions 44, which are electrically connected to the plurality of light detecting regions 43, are provided at the light detecting surface 42. This plurality of light detecting regions 43 includes two light detecting regions 43 disposed adjacent to each other. This plurality of light detecting regions 43 include two light detecting regions 43 disposed at both ends. This plurality of light detecting regions 43 include two light detecting regions 43 having different lengths in the second direction. This plurality of light detecting regions 43 includes all the light detecting regions 43 provided at the light detecting surface 42.

In the illustrated example of the light detecting element 40, the plurality of wiring regions 44 are electrically connected to all the light detecting regions 43 disposed at the light detecting surface 42. Specifically, four wiring regions 44 are electrically connected to the three light detecting regions 43. In other words, the number of wiring regions 44 is greater than the number of light detecting regions 43 at the light detecting surface 42.

Three of the four wiring regions 44 are each electrically connected to one of anode electrodes of the three light detecting regions 43, without sharing the same anode electrode with each other. The remaining one wiring region 44 is electrically connected to a cathode electrode common to the three light detecting regions 43.

The plurality of wiring regions 44 are provided in the end region 47 at the light detecting surface 42 (illustrated in FIG. 7). The end region 47 is a region at the light detecting surface 42 excluding a central region 46. By providing the plurality of wiring regions 44 in the end region 47, the size of the light detecting element 40 can be inhibited from increasing in the second direction. Further, it becomes easier to connect wires extending in the first direction to be bonded with the light detecting element 40.

Here, the first central region 461 and the second central region 462 are defined as the central region 46. The first central region 461 is, at the light detecting surface 42, sandwiched between a straight line extending in the second direction and passing through the midpoint of the width, in the first direction, of the light detecting region 43 that is disposed at the one end, of the light detecting regions 43 that are disposed at both ends, and a straight line extending in the second direction and passing through the midpoint of the width, in the first direction, of the light detecting region 43 that is disposed at the other end.

The second central region 462 is, at the light detecting surface 42, sandwiched between a straight line extending in the second direction and passing through an endpoint, of the light detecting region 43 that is disposed at the one end, of the light detecting regions 43 that are disposed at both ends, located farthest from the light detecting region 43 at the other end, and a straight line extending in the second direction and passing through an endpoint, of the light detecting region 43 that is disposed at the other end, located farthest from the light detecting region 43 at the one end.

The first central region 461 is included in the second central region 462. Thus, the end region 47 obtained when the second central region 462 is the central region 46 is included in the end region 47 obtained when the first central region 461 is the central region 46. Note that the central region 46 may include at least one of the first central region 461 and the second central region 462.

Of the plurality of wiring regions 44, a plurality of the wiring regions 44 electrically connected to the two light detecting regions 43 adjacent to each other are provided in the end region 47. Further, the wiring region 44 is not provided in the central region 46. Here, the central region 46 may be either one of the first central region 461 and the second central region 462.

Of the plurality of wiring regions 44, a plurality of the wiring regions 44 electrically connected to the two light detecting regions 43 disposed at both ends are provided in the end region 47. Further, the wiring region 44 is not provided in the central region 46. Here, the central region 46 may be either one of the first central region 461 and the second central region 462.

Of the plurality of wiring regions 44, a plurality of the wiring regions 44 electrically connected to the two light detecting regions 43 having the different lengths in the second direction are provided in the end region 47. The wiring region 44 is not provided in the central region 46. Here, the central region 46 may be either one of the first central region 461 and the second central region 462.

All the wiring regions 44 are provided in the end region 47. The wiring region 44 is not provided in the central region 46. The central region 46 may be either one of the first central region 461 and the second central region 462.

The end region 47 is divided into two separate regions with the central region 46 interposed therebetween. One of the regions separated by the central region 46 is referred to as a first portion of the end region 47, and the other region is referred to as a second portion of the end region 47.

One or more wiring regions 44 are provided in the first portion of the end region 47, and one or more wiring regions 44 are provided in the second portion of the end region 47. By providing the wiring regions 44 on both sides, wires are not concentrated in a portion on one side, so a spacing between the wires can be widened, and thus, wiring becomes easier. Note that a plurality of the wiring regions 44 may be provided in one of the first portion and the second portion, and the wiring region 44 need not necessarily be provided in the other portion.

The number of wiring regions 44 provided in the first portion of the end region 47, and the number of wiring regions 44 provided in the second portion of the end region 47 are preferably the same, or only different by one. In this way, by making the number of wiring regions 44 provided on each side evenly, the spacing between the wires can be widened, and thus, the wiring becomes easier. In the illustrated example of the light emitting device 1, two wiring regions 44 are provided in each of the first portion and the second portion of the end region 47.

A plurality of the conductive regions 45 are provided at the light detecting surface 42 of the light detecting element 40. Note that the conductive region 45 may be one, or the conductive region 45 need not necessarily be provided. The conductive region 45 connects the light detecting region 43 and the wiring region 44. As a result, the light detecting region 43 and the wiring region 44 are electrically connected to each other.

Here, the wiring region 44 and the conductive region 45 will be described. The wiring region 44 and the conductive region 45 may be formed from different materials, or may be formed from the same material. When the wiring region 44 and the conductive region 45 are formed from the same material, no visible boundary may be formed therebetween. In such a case, the wiring region 44 may be defined as follows, to specify the boundary between the wiring region 44 and the conductive region 45.

The plurality of wiring regions 44 are regions in which wires for electrically connecting the light detecting regions 43 are bonded. For example, a bonding device specifies positions at which the wiring regions 44 are provided, and bonds the wires. Thus, the wiring region 44 can be defined as a region in which the wire is actually bonded, based on the bonding relationship between the wiring region 44 and with the wire.

From a viewpoint of the design of the light detecting element 40, the wiring region 44 is provided in a predetermined shape as a target bonding position of the wire. When the plurality of wiring regions 44 are provided, it is efficient to provide the plurality of wiring regions 44 having the same shape. Thus, the wiring region 44 can be defined as a region having the outer shape and the size that are the same among a plurality of regions provided at the light detecting surface 42 for electrically connecting the light detecting regions 43.

Note that, in the illustrated example of the light detecting element 40, four regions are provided as the plurality of regions provided at the light detecting surface 42 for electrically connecting the light detecting regions 43. Further, one of the four regions is the wiring region 44 electrically connected to the cathode electrode of the light detecting regions 43. The remaining three regions are each a region in which the wiring region 44 and the conductive region 45, which are connected to each other and electrically connected to the anode electrode of the light detecting region 43, are combined with each other. Further, each of the wiring regions 44 is a region having the same rectangular shape and the same size as the outer shape.

Note that the shape of the regions provided as the target bonding positions of the wire need not necessarily be the same. In this case also, it is necessary to secure a minimum region required for bonding the wire. Thus, if the outer shape is not common to the regions, the maximum range that overlaps in the plurality of regions provided at the light detecting surface 42 for electrically connecting the light detecting regions 43 can be defined as the wiring region 44. Note that in the illustrated example of the light detecting element 40 also, the maximum range obtained by overlapping all the four regions is the wiring region 44.

Based on the wiring region 44 defined in this manner, regions obtained by excluding the wiring regions 44 from the regions provided at the light detecting surface 42 for electrically connecting the light detecting regions 43 can be defined as the conductive regions 45.

Note that the boundary between the wiring region 44 and the conductive region 45 is not limited to the boundary defined by the method described herein. For example, the boundary between the wiring region 44 and the conductive region 45 may be determined by a method that allows reasonable interpretation, when it is clearly distinguishable from a perspective of appearance, quality of material, or the like, or when it is clearly distinguishable from a manufacturing process of the light detecting element 40.

Each of the conductive regions 45 has a length in the second direction shorter than a length in the second direction of the light detecting region 43. The length in the second direction of conductive region 45 is shorter than a length in the second direction of the wiring region 44. The plurality of conductive regions 45 include the conductive region 45 whose length in the first direction is longer than a length in the first direction of the single light detecting region 43. The plurality of conductive regions 45 include the conductive region 45 whose length in the first direction is shorter than the length in the first direction of the single light detecting region 43.

The plurality of conductive regions 45, which connect the plurality of light detecting regions 43 with the plurality of wiring regions 44, are provided at the light detecting surface 42. This plurality of light detecting regions 43 include two of the light detecting regions 43 disposed adjacent to each other. This plurality of light detecting regions 43 include two of the light detecting regions 43 disposed at both ends. This plurality of light detecting regions 43 include two of the light detecting regions 43 having different lengths in the second direction.

This plurality of light detecting regions 43 includes all the light detecting regions 43 provided at the light detecting surface 42. This plurality of wiring regions 44 do not include one or more wiring regions 44, of all the wiring regions 44 provided at the light detecting surface 42. Note that this plurality of wiring regions 44 may include all of the wiring regions 44 provided at the light detecting surface 42.

In the illustrated example of the light detecting element 40, the plurality of conductive regions 45 are respectively connected to all the light detecting regions 43 disposed at the light detecting surface 42. Specifically, there are three conductive regions 45 connected to three light detecting regions 43. In other words, the number of light detecting regions 43 and the number of conductive regions 45 disposed at the light detecting surface 42 are the same.

Further, the conductive region 45 connects the light detecting region 43 and the wiring region 44 that is electrically connected to the anode electrode of that light detecting region 43. On the other hand, the wiring region 44 electrically connected to the cathode electrode of the light detecting regions 43 is not connected to the conductive region 45. This wiring region 44 is electrically connected to the cathode electrode of the light detecting regions 43, inside the light detecting element 40.

By electrically connecting some of the wiring regions 44 with the light detecting region 43 inside the light detecting element 40, the number of conductive regions 45 provided at the light detecting surface 42 can be reduced, thereby contributing to downsizing of the light detecting element 40. Note that the conductive region 45 may be provided connecting the cathode electrode of the light detecting region 43 and the wiring region 44.

The plurality of conductive regions 45 include the conductive region 45 provided extending from the central region 46 across to the end region 47. The plurality of conductive regions 45 include the conductive region 45 that is provided in the end region 47 but not in the central region 46. Note that, here, the central region 46 may be either one of the first central region 461 and the second central region 462.

The plurality of conductive regions 45 include the conductive region 45 connected to one of the two light detecting regions 43 disposed adjacent to each other and provided extending from the central region 46 across to the end region 47, and the conductive region 45 connected to the other of the two light detecting regions 43 and provided in the end region 47 without being provided in the central region 46. Further, the other of the two light detecting regions 43 is the light detecting region 43 disposed at an end in the first direction, of the plurality of light detecting regions 43 disposed side by side in the first direction.

Of the two conductive regions 45 connected to the two light detecting regions 43 disposed adjacent to each other, the conductive region 45 provided extending from the central region 46 across to the end region 47 and the conductive region 45 provided in the end region 47 but not provided in the central region 46 both extend in the first direction from a position thereof connected to the light detecting regions 43, and both are connected to the wiring region 44. Each of the wiring regions 44 is also provided at a position closer to the light detecting region 43 disposed at the end, of the first portion and the second portion of the end region 47.

The conductive region 45 provided extending from the central region 46 across to the end region 47 is connected to one side of the two facing sides of one of the two light detecting regions 43 disposed adjacent to each other. This conductive region 45 extends, from a position thereof connected to the one side, in the first direction in parallel with the first direction, and is connected to the wiring region 44.

The light detecting element 40 includes the light detecting region 43 sandwiched between a straight line parallel to the second direction and passing through one end, which is connected to the light detecting region 43, of both ends of the conductive region 45 that extends from the central region 46 across to the end region 47, and a straight line parallel to the second direction and passing through the other end, which is connected to the wiring region 44. In an example illustrated in FIG. 7, the light detecting region 43 having the shorter length in the second direction is provided in a range of the width S illustrated in the drawing.

Here, the conductive region 45 electrically connected to one of the two light detecting regions 43 disposed adjacent to each other and extending from the central region 46 across to the end region 47 is not electrically connected to the other of the two light detecting regions 43. A method for avoiding electrical connection is one in which an insulating region is provided on a portion of the other of the two light detecting regions 43, and the conductive region 45 is provided over the insulating region. Since the insulating region is provided on the light detecting region 43, the position of the insulating region can be adjusted.

Also, there is a method of providing the conductive region 45 in a portion at which the two light detecting regions 43 are shifted in the second direction. Since the conductive region 45 is provided in the portion at which no light detecting region 43 is provided, there is no need to separately provide the insulating region on the light detecting region 43 at the light detecting surface 42.

When the insulating region is provided, this insulating region reduces the light detecting region 43 at the light detecting surface 42. As a result, substantially, the shifted portion is created in the alignment of the two light detecting regions 43 adjacent to each other in the second direction. In other words, in either of the methods, the conductive region 45 is connected to one adjacent light detecting region 43 at a portion thereof protruding more than the other light detecting regions 43 in the second direction, extends in a direction parallel to the first direction, and is connected to the wiring region 44.

The conductive region 45 that is provided in the end region 47 and is not provided in the central region 46 is connected to the side opposite to the side facing the adjacent light detecting region 43, in the light detecting region 43 disposed at the end of the two adjacent light detecting regions 43.

Note that the conductive region 45 provided extending from the central region 46 across to the end region 47 is preferably connected to the light detecting region 43 in the vicinity of the upper end or the lower end of the light detecting region 43. This is because the closer the conductive region 45 is to the end, the more the reduction of the other of the two adjacent light detecting region 43 can be suppressed, and as a result, a large light detecting region can be secured.

At the light detecting surface 42, the wiring regions 44 are preferably provided in a region sandwiched by a straight line extending in the first direction and passing through one end of both ends, of the plurality of light detecting regions 43, located farthest in the second direction, and a straight line extending in the first direction and passing through the other end of both ends. The size of the light detecting element 40 can be inhibited from increasing in the second direction. In the example illustrated in FIG. 7, all the wiring regions 44 are provided in a range a width T illustrated in the drawing. Note that the same is true even when the wiring region 44 is replaced by the conductive region 45.

At the light detecting surface 42, the wiring regions 44 are preferably provided so to be close to one of the ends of the light detecting surface 42, rather than being provided so to be close to the center of the light detecting surface 42.

For example, the wiring region 44 located closest to the one end of both ends, of the plurality of light detecting regions 43, located farthest in the second direction, and the wiring region 44 located closest to the other end of both ends are both preferably located closer to the one end than to the other end. Further, it is preferable that the same be true even when the plurality of light detecting regions 43 are replaced by the light detecting surface 42.

Also, for example, the wiring region 44 located closest to the one end of the both ends, of the plurality of light detecting regions 43, located farthest in the second direction is preferably provided at a position closer to the one end than to the center of the both ends, and the wiring region 44 located closest to the other end of both ends is preferably provided at a position closer to the center of both ends than to the other end. Further, it is preferable that the same be true even when the plurality of light detecting regions 43 are replaced by the light detecting surface 42.

In the example of FIG. 7, an imaginary line P illustrated in the drawing indicates a center line of both ends, of the plurality of light detecting regions 43, located farthest in the second direction, respectively. The imaginary line P indicates a center line of the light detecting surface 42. One of the two wiring regions 44 in the first portion of the end region 47 is the wiring region 44 located closest to the one end of the both ends, and the other of the two wiring regions 44 is the wiring region 44 closest to the other end of the both ends. The same is true even when the first portion is replaced by the second portion.

For example, a photodiode (hereinafter an abbreviated designation PD will be used) may be used as the light detecting element 40. Further, the light detecting element 40 reflects 80% or more of light with which the light detecting region 43 is irradiated.

Support Base 50

The support base 50 has a lower surface and an inclined surface 51 inclined with respect to the lower surface. The inclined surface 51 is not perpendicular nor parallel when viewed from the lower surface. For example, the inclined surface 51 is constituted by a flat surface having an inclination angle in a range from 40 degrees to 50 degrees with respect to the lower surface. In the illustrated example of the light emitting device 1, the inclined surface 51 is constituted by a flat surface having the inclination angle of 45 degrees with respect to the lower face. Note that the inclined surface 51 may be formed with an inclination angle in a range from 10 degrees to 80 degrees.

The inclined surface 51 is one or a plurality of inclined surfaces inclined with respect to the lower surface at the support base 50, and when the plurality of inclined surfaces are provided, the inclined surface 51 has the largest area. Further, when viewed in a top view, the inclined surface 51 occupies an area of 60% or more of the support base 50. Further, when viewed in a top view, a width from the upper end to the lower end of the inclined surface 51 is 60% or more of the width of the support base 50 in the same direction. In other words, the inclined surface 51 occupies a main proportion of the support base 50.

The support base 50 can be formed using, for example, ceramic, glass, metal, or the like. For example, ceramic such as aluminum nitride, glass such as quartz or borosilicate glass, or metal such as aluminum can be used. Alternatively, Si or the like may also be used to form the support base 50.

Protective Element 60

The protective element 60 is provided for preventing breakage of a specific element (the semiconductor laser element 20, for example) as a result of an excessive current flowing through the element. The protective element 60 is a Zener diode, for example. Further, as the Zener diode, a Zener diode formed from Si can be employed.

Wire 70

The wire 70 is formed in a linear shape with bonded portions at both ends. In other words, the wire 70 includes the bonded portions that are bonded to other components, at both ends of the linear portion. The wire 70 is, for example, a metal wire. For example, gold, aluminum, silver, copper, or the like can be used as the metal.

Lid Member 80

The lid member 80 has a lower surface and an upper surface, and is formed in a flat plate-like cuboid shape. Note that the shape need not necessarily be the cuboid shape. Further, the lid member 80 has light transmissivity that can transmit the light. Here, "having light transmissivity" means that the light transmittance is 80% or more. Note that the light transmittance with respect to all wavelengths need not necessarily be 80% or more. Further, the lid member 80 may partially include a non-light transmissive region (a region that does not have light transmissivity).

The lid member 80 can be formed using sapphire. Sapphire is a light-transmissive material, and has a relatively high refractive index and a relatively high strength. Note that, instead of the sapphire, for example, glass or the like can also be used.

Light Emitting Device 1

Next, the light emitting device 1 will be described.

The light emitting device 1 includes the base member 10, the semiconductor laser element 20 disposed at the base member 10, the light detecting element 40 disposed at the base member 10, a plurality of first wires 71, of the plurality of wires 70, for electrically connecting the semiconductor laser element 20, and a plurality of second wires 72, of the plurality of wires 70, for electrically connecting the light detecting element 40. Note that another light emitting element such as an LED may be used instead of the semiconductor laser element 20.

In the light emitting device 1, the semiconductor laser element 20 is disposed at the base member 10 via the submount 30. Note that the semiconductor laser element 20 may be disposed directly at the bottom surface of the base member 10 without interposing the submount 30 therebetween. When the submount 30 is not interposed, the outer shape of the semiconductor laser element 20 may be changed to adjust an emission position (height) of light at the emission end surface.

The light detecting element 40 is also disposed at the base member 10 via the support base 50. Note that the light detecting element 40 may be disposed directly at the bottom surface of the base member 10 without interposing the support base 50 therebetween. When the support base 50 is not interposed, the outer shape of the light detecting element 40 may be changed to adjust the position (height) and orientation (inclination) of the light detecting surface 42.

The light emitting device 1 is disposed at the base member 10, and includes the protective element 60 that protects the semiconductor laser element 20. The light emitting device 1 includes the lid member 80 that is bonded to the base member 10 and seals a space in which the semiconductor laser element 20 is disposed.

The semiconductor laser element 20 is disposed on the bottom surface (in the arrangement region) of the base member 10. A plurality of the semiconductor laser elements 20 may be disposed. The plurality of semiconductor laser elements 20 are disposed side by side so that the emission end surfaces thereof face the same direction. Between the semiconductor laser elements 20 adjacent to each other, lateral surfaces intersecting the respective emission end surfaces face each other.

Here, in the light emitting device 1, in a top view, a direction in which the plurality of semiconductor laser elements 20 are disposed side by side is referred to as the first direction. Further, in a top view, a direction perpendicular to the first direction is referred to as the second direction. The first direction and the second direction in the illustrated example of the light emitting device 1 are indicated by 1D and 2D in FIG. 3, respectively. Note that when the single semiconductor laser element 20 having a plurality of emitters is disposed, a direction in which the plurality of emitters are disposed may be referred to as the first direction.

In the illustrated example of the light emitting device 1, three of the semiconductor laser elements 20 are disposed. The first direction is parallel to the emission end surface of the semiconductor laser element 20 in a top view. The lateral surfaces intersecting the respective emission end surfaces and facing each other between the adjacent semiconductor laser elements 20 are parallel to each other in a top view.

The three semiconductor laser elements 20 are constituted by the semiconductor laser element that emits blue light, the semiconductor laser element that emits green light, the semiconductor laser element that emits red light. Note that the present invention is not limited to this configuration, and may adopt a configuration in which a plurality of semiconductor laser elements that emit light of the same color are provided, or may adopt a configuration in which a semiconductor laser element that emits light of another color is provided.

The submount 30 is bonded to the semiconductor laser element 20 at one of the bonding surfaces. Further, the submount 30 is bonded to the bottom surface of the base member 10 at the other bonding surface on the opposite side from the one of the bonding surfaces. Note that the light emitting device 1 may include a plurality of the submounts 30. The number of semiconductor laser elements 20 disposed at the single submount 30 may be one.

The light detecting element 40 is disposed on the bottom surface of the base member 10. The light detecting surface 42 is oriented in an irradiation direction of the light emitted from the semiconductor laser element 20. Further, the plurality of light detecting regions 43 at the light detecting surface 42 are irradiated with the main portion of light emitted from the semiconductor laser element 20. The single light detecting region 43 is irradiated with the main portion of light of at least one laser beam. In other words, the single light detecting region 43 may be irradiated with the main portion of light of two laser beams.

In the illustrated example of the light emitting device 1, the plurality of light detecting regions 43 provided at the light detecting surface 42 of the light detecting element 40 are irradiated with the light emitted from the plurality of semiconductor laser elements 20. Further, the single light detecting region 43 corresponds to the single semiconductor laser element 20, and the single light detecting region 43 is irradiated with the main portion of light emitted from the single semiconductor laser element 20.

Specifically, the three light detecting regions 43 are irradiated with at least the main portion of light emitted from the three semiconductor laser elements 20. The single light detecting region 43 is irradiated with two laser beams emitted respectively from the two emitters included in the single semiconductor laser element 20.

The light detecting element 40 receives (absorbs) a portion of the light, and reflects a portion of the light with which the light detecting region 43 is irradiated. The light detecting region 43 receives 2% or more of the main portion of the emitted light. Further, the light detecting region 43 reflects 80% or more of the main portion of the emitted light. Note that the sum of the received light and the reflected light is 100% or less.

The first direction in the light emitting device 1 and the first direction in the light detecting element 40 are the same direction and parallel to each other. In a top view, the emission end surface of the semiconductor laser element 20 is parallel to the side at the lower end or the side at the upper end of the light detecting surface 42 of the light detecting element 40. Note that the term "parallel" used here allows a difference within ±5 degrees. Note that the emission end surface of the semiconductor laser element 20 need not necessarily be parallel to the side at the lower end or the side at the upper end of the light detecting surface 42.

The light detecting region 43 reflects light emitted laterally from the semiconductor laser element 20 upward. Thus, the light detecting surface 42 is inclined with respect to the emission end surface and the optical axis. Further, the light detecting surface 42 is inclined with respect to the bottom surface of the base member 10. The light detecting surface 42 is inclined with respect to a traveling direction of the light passing through the optical axis, at an angle in a range from 40 degrees to 50 degrees. In the illustrated example of the light emitting device 1, the light detecting surface 42 is inclined at 45 degrees. Note that the light detecting surface 42 may be inclined at an angle in a range from 10 degrees to 80 degrees.

The wiring region 44 of the light detecting element 40 is disposed at a position that does not enter an optical path of the main portion of light emitted from the semiconductor laser element 20. Further, the second wire 72 bonded to the wiring region 44 is disposed at a position that does not enter the optical path of the main portion of light.

Thus, the plurality of wiring regions 44 are provided in the end region 47 at the light detecting surface 42. Here, this end region 47 is a region excluding the central region 46, and also defines the third central region 463 as this central region 46.

In a top view, on the light detecting surface 42, the third central region 463 is sandwiched between a straight line extending in the second direction and passing through an irradiation point of the light passing through the optical axis of light with which the light detecting region 43 disposed at one end of the light detecting regions 43 that are disposed at both ends is irradiated, and a straight line extending in the second direction and passing through an irradiation point of the light passing through the optical axis of light with which the light detecting region 43 disposed at the other end of the light detecting regions 43 that are disposed at both ends is irradiated. Note that the third central region 463 may be a region including at least this region.

Note that when the single light detecting region 43 is irradiated with a plurality of the laser beams, it is sufficient that the above-described definition of the third central region 463 be satisfied based on at least one of the laser beams. Further, it is preferable that the above-described definition of the third central region 463 be satisfied based on the laser beams with which both ends of the light detecting region 43 are irradiated, located farthest in the first direction. In the example of FIG. 4, the third central region 463, which is obtained when it is defined based on the laser beams with which both ends, of the light detecting regions 43, located farthest in the first direction are irradiated is indicated by hatching.

When the plurality of light detecting regions 43 in the light detecting element 40 include the two light detecting regions 43 having the different lengths in the second direction, the light detecting region 43 to be irradiated with the laser beam may be determined in accordance with the vertical spread angles of the plurality of laser beams emitted from the semiconductor laser element 20. This is because the larger the vertical spread angle of the laser beam is, the longer an irradiation region formed in the light detecting region 43 becomes in the second direction.

Thus, it is preferable that the light detecting region 43 that is longer in length in the second direction, of the two light detecting regions 43 having the different lengths in the second direction, is irradiated with the main portion of light of the laser beam having the largest vertical spread angle, among the plurality of laser beams. In other words, it is preferable that the light detecting region 43 that is shorter in length in the second direction, of the two light detecting regions 43 having the different lengths in the second direction, be not irradiated with the main portion of light of the laser beam having the largest vertical spread angle among the plurality of laser beams onto.

In the illustrated example of the light emitting device 1, a length in the second direction of the light detecting region 43 disposed at the one end of the light detecting regions 43 that are disposed at both ends, among the plurality of light detecting regions 43 disposed in the first direction, is smaller than a length in the second direction of the light detecting region 43 disposed adjacent to that light detecting region 43.

Thus, the semiconductor laser elements 20 and the light detecting element 40 are disposed so that the light detecting region 43 that is shorter in length in the second direction than the light detecting region 43 disposed at one end, of both ends, and adjacent to that light detecting region 43 is not irradiated with the main portion of light emitted from the semiconductor laser element 20 having the largest vertical spread angle among the plurality of semiconductor laser elements 20, whereas the other light detecting region 43 that is longer in length in the second direction than that light detecting region 43 is irradiated therewith.

Specifically, the light detecting region 43 that is disposed at a longer end in length in the second direction, of the light detecting regions 43 disposed at the both ends is irradiated with the main portion of light emitted from the semiconductor laser element 20 that emits the red light and that has the largest vertical spread angle of light, of the three semiconductor laser elements 20.

Although the light detecting region 43 sandwiched between the light detecting regions 43 disposed at both ends is also the light detecting region 43 that is longer in length in the second direction, it is preferable that the semiconductor laser element 20 that is more susceptible to heat than the other semiconductor laser elements 20 be disposed at the end. In the illustrated example of the light emitting device 1, the semiconductor laser element 20 that emits red light has light emission characteristics that cause the semiconductor laser element 20 to be more susceptible to heat than the semiconductor laser element 20 that emits blue light and the semiconductor laser element 20 that emits green light.

The conductive region 45 provided extending from the first central region 461 or the second central region 462 across to the end region 47 extends from the third central region 463 across to the end region 47. This conductive region 45 provided extending from the central region 46 across to the end region 47 is provided in the vicinity of the upper end of the light detecting region 43 disposed at an end in the light emitting device 1. This conductive region 45 is also disposed at a position that does not enter the optical path of the main portion of light emitted from the semiconductor laser element 20.

Thus, the conductive region 45 provided extending from the central region 46 across to the end region 47 is disposed, at the light detecting surface 42, below a straight line extending in the first direction and passing through the upper end of the light detecting region 43 disposed adjacent to the light detecting region 43 disposed at an end, and above the upper end of the main portion of light with which the light detecting region 43 disposed at an end is irradiated, and the conductive region 45 connects the adjacent light detecting region 43 and the wiring region 44.

Note that the conductive region 45 provided extending from the central region 46 across to the end region 47 may be provided in the vicinity of the lower end of the light detecting region 43 disposed at an end of the light emitting device 1. In this case, the conductive region 45 is provided above a straight line extending in the first direction and passing through the lower end of the light detecting region 43 disposed adjacent to the light detecting region 43 disposed at an end, and below the lower end of the main portion of light with which the light detecting region 43 disposed at the end is irradiated, and the conductive region 45 connects the adjacent light detecting region 43 and the wiring region 44.

The support base 50 is bonded to the light detecting element 40 at the inclined surface 51. In other words, the light detecting element 40 is disposed on the inclined surface 51. Further, the support base 50 is disposed such that the inclined surface 51 is oriented toward the semiconductor laser element 20. By disposing the light detecting element 40 via the support base 50, the light detecting element 40 need not necessarily be formed in a complex shape. Thus, a material that is easier to shape than that of the light detecting element 40 is preferably used for the support base 50.

Further, the lower surface of the support base 50 is bonded to the bottom surface of the base member 10. As a result of the lower surface of the support base 50 being bonded to the bottom surface of the base member 10, the inclined surface 51 is inclined with respect to the bottom surface. Further, since the lower surface of the support base 50 and the bottom surface of the base member 10 are in a parallel relationship, an inclination angle of the inclined surface 51 with respect to the bottom surface of the base member 10 is the same as an inclination angle of the inclined surface 51 with respect to the lower surface of the support base 50.

Since the light detecting element 40 is irradiated with light that has been emitted from the semiconductor laser element 20 and spread, the light detecting surface 42 needs to be provided extending from a position lower than a light emission point of the semiconductor laser element 20 to a position higher than the light emission point. Thus, a height of the lower end of the light detecting surface 42 of the light detecting element 40 disposed in the light emitting device 1 is lower than the light emission point of the semiconductor laser element 20, and a height of the upper end of the light detecting surface 42 is higher than the light emission point of the semiconductor laser element 20.

In a state in which the semiconductor laser element 20 and the light detecting element 40 are disposed on the base member 10, the stepped portion 13 is provided at a position separated from the semiconductor laser element 20 or the light detecting element 40 in the first direction. The stepped portion 13 are provided at positions separated from the semiconductor laser element 20 or the light detecting element 40 in both directions of the first direction, respectively. In a top view, the stepped portion 13 is provided such that the semiconductor laser element 20 and the light detecting element 40 are sandwiched in parallel with them.

The stepped portion 13 is provided at a position separated from the semiconductor laser element 20 or the light detecting element 40 in the second direction. The stepped portion 13 is provided at a position separated in a direction from the light detecting element 40 toward the semiconductor laser element 20, of both directions of the second direction. Note that this stepped portion 13 need not necessarily be provided.

The stepped portion 13 is provided extending at the position separated from the semiconductor laser element 20 or the light detecting element 40 in both directions of the first direction and in one direction of the second direction. Note that the stepped portions 13 may be separated from each other. Further, the stepped portion 13 is not provided at a position separated from the semiconductor laser element 20 or the light detecting element 40 in the other direction of the second direction. Note that the stepped portion 13 may be provided at that position.

In the state in which the semiconductor laser element 20 and the light detecting element 40 are disposed at the base member 10, the wiring region 14 is provided at a position separated from the semiconductor laser element 20 or the light detecting element 40 in the first direction. The wiring regions 14 are provided at positions separated from the semiconductor laser element 20 or the light detecting element 40 in both directions of the first direction, respectively.

The wiring region 14 is provided at a position separated from the semiconductor laser element 20 or the light detecting element 40 in the second direction. The stepped portion 13 is provided at a position separated in a direction from the light detecting element 40 toward the semiconductor laser element 20, of both directions of the second direction. Note that this wiring region 14 need not necessarily be provided.

One end of both ends of the first wire 71 is bonded to the wiring region 14. Further, the other end of both ends of the first wire 71 is bonded to the upper surface of the semiconductor laser element 20 or the upper surface of the submount 30. A bonding region for the bonding with the first wire 71 is provided at the upper surface of the semiconductor laser element 20 or the upper surface of the submount 30.

Thus, in a state in which the semiconductor laser element 20 and the submount 30 are disposed on the base member 10, it is preferable that the upper surface of the stepped portion 13 of the base member 10 be above the upper surface of the submount 30 and below the upper surface of the semiconductor laser element 20, in a height direction (up-down direction). In this way, the first wire 71 can be easily connected. Note that all of the plurality of first wires 71 need not necessarily be bonded to the wiring region 14 of the stepped portion 13. One end of one or a plurality of the first wires 71 is bonded to the wiring region 14.

In a top view, the first wire 71 is bonded to the wiring region 14 of the base member 10 on the semiconductor laser element 20 side (a side including the lateral surface opposite from the emission end surface of the semiconductor laser element 20), when a straight line parallel to the emission end surface of the light from the semiconductor laser element 20 is set as a boundary. As a result, it becomes easier to inhibit the first wire 71 from entering the optical path of the light.

One end of both ends of the second wire 72 is bonded to the wiring region 14. The other end of both ends of the second wire 72 is bonded to the wiring region 44 of the light detecting element 40. By providing the wiring region 44 in the end region 47, a distance between the wiring region 14 of the base member 10 and the wiring region 44 of the light detecting element 40 can be shortened, and the length of the second wire 72 can be shortened. Further, the height of the second wire 72 can be reduced, and a light emitting device with a reduced height can be realized.

The plurality of second wires 72 are bonded to the wiring region 14 of the base member 10 and to the wiring region 44 of the light detecting element 40. Further, all of the wires used for electrical connection of the light detecting element 40 are bonded to the wiring region 14. Note that all of the wires used for electrical connection of the light detecting element 40 need not necessarily be bonded to the wiring region 14. One end of one or a plurality of the second wires 72 is bonded to the wiring region 14.

In a top view, the second wire 72 is bonded to the wiring region 14 of the base member 10 on the light detecting element 40 side, when the straight line parallel to the emission end surface of the light from the semiconductor laser element 20 is set as the boundary. As a result, it becomes easier to inhibit the second wire 72 from entering the optical path of the light.

In a top view, at least one or more of the plurality of second wires 72 are bonded to the wiring region 14 of the base member 10 in a region sandwiched by a straight line extending in the first direction and passing through one end of both ends, of the light detecting element 40, located farthest in the second direction, and a straight line extending in the first direction and passing through the other end of the both ends. Preferably, a plurality of the second wires 72, or more preferably, all of the second wires 72 are bonded to the wiring region 14 in this region. As a result, the length of the second wire 72 can be reduced.

In a top view, at least one or more of the plurality of second wires 72 are bonded to the wiring region 14 of the base member 10 in the region sandwiched by the straight line extending in the first direction and passing through one end of the both ends, of the light detecting surface 42, located farthest in the second direction, and the straight line extending in the first direction and passing through the other end of the both ends. Preferably, a plurality of the second wires 72, or more preferably, all of the second wires 72 are bonded to the wiring region 14 inside this region. Similarly, the length of the second wire 72 can be reduced.

In the example of FIG. 4, a region of the width Y indicates the region sandwiched by the straight line extending in the first direction and passing through the one end of both ends, of the light detecting element 40, located farthest in the second direction of the light detecting surface 42, and the straight line extending in the first direction and passing through the other end of both ends. Further, all of the second wires 72 are bonded to the wiring region 14 of the base member 10 inside the region of the width Y.

Further, all of the second wires 72 are bonded to the wiring region 44 of the light detecting element 40 at positions higher than the submount 30. As illustrated in the cross-sectional view of FIG. 5, in the illustrated example of the light emitting device 1, a height from the bottom surface of the base member 10 to the bonding position of the second wire 72 in the wiring region 44 is greater than a height from the bottom surface of the base member 10 to the upper surface of the submount 30.

In the light detecting element 40, the wiring region 44 is not located near the center, but is located near one of the ends. Thus, the second wire 72 can be bonded to a position near the upper end of the light detecting element 40, and the second wire 72 can thus be bonded at a position higher than the upper surface of the submount 30. When bonding the second wire 72, the bonding device needs to be disposed so as not to come into contact with the semiconductor laser element 20. By disposing the wiring region 44 near the upper end of the light detecting element 40, the light detecting element 40 can be disposed close to the semiconductor laser element 20.

Further, in the light emitting device 1, there is no wire passing directly above the upper end of the light detecting element 40. In other words, even when a wire other than the wires 70 is additionally provided, all of the wires disposed in the recess of the base member 10 do not pass directly above the upper end of the light detecting element 40. Therefore, the second wire 72 is bonded to the wiring region 14 and the wiring region 44, without passing directly above the upper end of the light detecting element 40. As a result, the height of the wire can be reduced, and thus, the height of the light emitting device 1 can be reduced.

Further, in the light emitting device 1, there is no wire passing through a region directly above the light detecting surface 42. Thus, the second wire 72 is bonded to the wiring region 14 and the wiring region 44, without passing through the region directly above the light detecting surface 42. As a result, it becomes easier to inhibit the second wire 72 from entering the optical path of the light.

In the illustrated example of the light emitting device 1, the number of first wires 71 provided for the electrical connection of the semiconductor laser element 20 is greater than the number of second wires 72 provided for the electrical connection of the light detecting element 40. By providing the wiring region 14 at the position separated in the direction from the light detecting element 40 toward the semiconductor laser element 20, of both directions of the second direction, a region in which the first wires 71 are bonded is secured, and thus, the wires can be easily bonded.

The protective element 60 is disposed at the upper surface of the stepped portion 13. By disposing the protective element 60 at the stepped portion 13, the arrangement region can be made small, thereby contributing to the downsizing of the light emitting device 1. Further, a plurality of the protective elements 60 are disposed at the upper surface of the stepped portion 13.

In a top view, one or more protective elements 60 are disposed on the semiconductor laser element 20 side and on the light detecting element 40 side, respectively, when the straight line parallel to the emission end surface of the light from the semiconductor laser element 20 is set as the boundary. Further, the number of protective elements 60 disposed on the semiconductor laser element 20 side is greater than the number of protective elements 60 disposed on the light detecting element 40 side. Since a region in which the wiring region 14 can be secured is larger on the semiconductor laser element 20 side, it becomes easier to bond the first wires 71 and the second wires 72.

Further, in a top view, when the straight line parallel to the emission end surface of the light from the semiconductor laser element 20 is set as the boundary, the second wire 72 and the protective element 60 are disposed in the wiring region 14 in this order in the direction toward the light detecting element 40. By disposing the second wire 72 and the protective element 60 in this order, bonding becomes easier with a reduced length of the second wire 72. Note that the order may be reversed.

The lid member 80 is disposed on the upper surface of the base member 10. The lid member 80 is positioned above the stepped portion 13. As a result of the lid member 80 being bonded, a closed space surrounded by the base member 10 and the lid member 80 is generated. This space is a space in which the semiconductor laser element 20 is disposed. In the illustrated example of the light emitting device 1, as a result of the lid member 80 and the base member 10 being bonded to each other, a plurality of the semiconductor laser elements 20 disposed on the base member 10 are sealed.

Further, by bonding the lid member 80 to the base member 10 under a predetermined atmosphere, a hermetically sealed closed space is created. By hermetically sealing the space in which the semiconductor laser element 20 is disposed, a deterioration in quality due to dust gathering can be suppressed. Further, the lid member 80 has light transmissivity with respect to the light emitted from the semiconductor laser element 20.

In the light emitting device 1, 80% or more of the main portion of light emitted from all of the semiconductor laser elements 20 is emitted upward to the outside. All of the semiconductor laser elements 20 are disposed side by side in the first direction in the light emitting device 1 and configured to irradiate the light detecting element 40 with the main portion of light.

In the light emitting device 1, an output of the light emitted from the semiconductor laser element 20 can be controlled based on a light detection result by the light detecting element 40. As a result, the output of the light emitted from the light emitting device 1 can be controlled.

Second Embodiment

Figure 8:
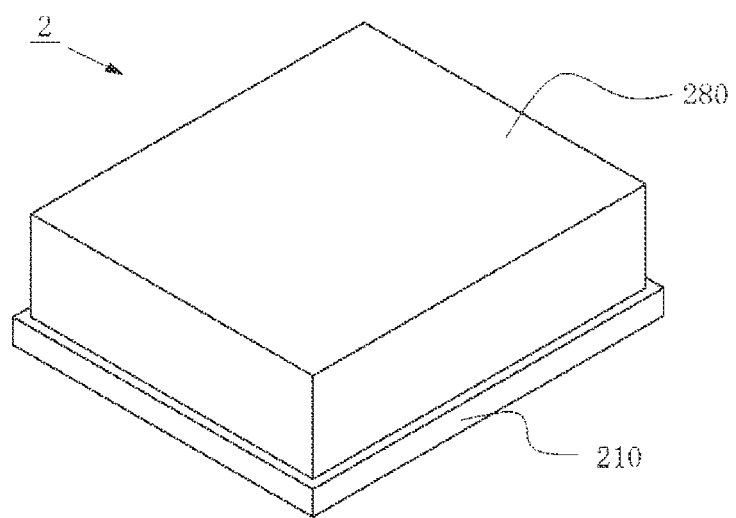
FIG. 8 is a perspective view of a light emitting device according to a second embodiment.
Figure 9:
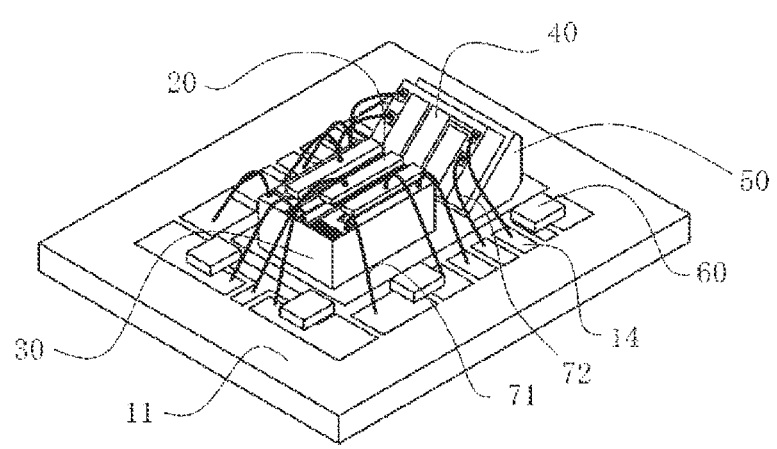
FIG. 9 is a perspective view of the light emitting device according to the second embodiment, in a state in which a lid member is removed.

A light emitting device 2 according to a second embodiment will be described. FIGS. 8 and 9 are drawings for explaining an exemplary form of the light emitting device 2. FIG. 8 is a perspective view of the light emitting device 2. FIG. 9 is a perspective view of the light emitting device 2 in a state in which a lid member 280 is removed.

The light emitting device 2 has a plurality of components including a base member 210, the semiconductor laser element 20, the submount 30, the light detecting element 40, the support base 50, the plurality of wires 70, and the lid member 280. Further, the light emitting device 2 of the second embodiment differs from the light emitting device 1 of the first embodiment in that the base member 210 and the lid member 280 have different shapes from those of the base member 10 and the lid member 80.

The base member 210 does not have the lateral surface portion 12. Further, the base member 210 is formed in a flat plate shape having an upper surface, a lower surface, and a lateral surface. A surface at which the semiconductor laser element 20 is disposed and a surface at which the wiring region 14 is provided are on the same plane. Note that those surfaces need not necessarily be on the same plane. For example, the base member 210 may include the stepped portion 13, but may not have the upper surface above the stepped portion 13.

Because the base member 210 does not include the lateral surface portion 12, there is no need to keep a certain distance from the lateral surface portion 12 so as not to cause the bonding device, which performs the bonding of the wire 70, to come into contact with the lateral surface portion 12, when the wire 70 is bonded to the wiring region 14.

The lid member 280 is formed in a cap shape having a side wall. The side wall also surrounds the arrangement region and the wiring region 14. The side wall is formed up to a position higher than each of the semiconductor laser element 20, the light detecting element 40, and the wires 70 disposed at the base member 210. As a result of the lid member 280 being bonded to the upper surface of the base member 210, a space in which the semiconductor laser element 20 is disposed becomes a hermetically sealed closed space.

Although the embodiments according to the present invention have been described above, the light emitting device according to the present invention is not strictly limited to the light emitting devices according to the embodiments. In other words, the present invention can be realized without being limited to the outer shape and the structure of the light emitting device disclosed by each of the embodiments described above. For example, the light emitting device according to the present invention may be a light emitting device that does not include a protective element. Further, the light emitting device according to the present invention can be applied without requiring that all necessary components be sufficiently provided. For example, when some components of the light emitting device disclosed by the embodiment are not described in the scope of the claims, with respect to those components, a degree of freedom in design by those skilled in the art, such as substitutions, omissions, modifications in shape, and changes in material, is acknowledged, and after those design changes are implemented, the invention described in the scope of the claims may be applied.

INDUSTRIAL APPLICABILITY

The light emitting device according to each of the embodiments described above can be used for a head-mounted display, a projector, an on-vehicle headlight, lighting, a display, and the like.

REFERENCE SIGNS LIST 1, 2 Light emitting device
10, 210 Base member
11 Bottom surface portion
12 Lateral surface portion
13 Stepped portion
14 Wiring region
20 Semiconductor laser element
30 Submount
40 Light detecting element
41 Bonding surface
42 Light detecting surface
43 Light detecting region
44 Wiring region
45 Conductive region
46 Central region
461 First central region
462 Second central region
463 Third central region
47 End region
50 Support base
51 Inclined surface
60 Protective element
70 Wire
71 First wire
72 Second wire
80, 280 Lid member

The invention claimed is:

1. A light detecting element comprising:
a light detecting surface comprising:
a plurality of light detecting regions disposed in a row in a first direction, the plurality of light detecting regions including:
a first light detecting region, which is an outermost one of the light detecting regions at a first end of the row, and
a second light detecting region, which is an outermost one of the light detecting regions at a second end of the row opposite the first end, wherein:
each of the plurality of light detecting regions is longer in a second direction than in the first direction, the second direction being perpendicular to the first direction, such that each light detecting region has a pair of lateral edges that extend in the first direction and pair of longitudinal edges that are longer than the lateral edges and extend in the second direction, and
a plurality of wiring regions electrically connected to the plurality of light detecting regions, the plurality of wiring regions including:
a first wiring region electrically connected to the first light detecting region, and
a second wiring region electrically connected to the second light detecting region, wherein:
in a top view, the first and second wiring regions are located in an end region of the light detecting surface located outward of a central region of the light detecting surface, and are not located in the central region, the central region being defined as a region between (i) a straight line extending in the second direction on an outermost longitudinal edge of the first light detecting region and (ii) a straight line extending in the second direction on an outermost longitudinal edge of the second light detecting region, and
in a top view, the plurality of wiring regions are located between straight lines extending in the first direction on outermost opposite lateral edges of the light detecting regions.

2. The light detecting element according to claim 1, wherein:
the end region includes a first portion and a second portion, separated from each other by the central region,
the first wiring region is located in the first portion of the end region, and
the second wiring region is located in the second portion of the end region.

3. The light detecting element according to claim 1, wherein:
the light detecting surface further comprises a plurality of conductive regions that connect the plurality of light detecting regions and the plurality of wiring regions, and
the plurality of conductive regions include a conductive region extending from the central region across to the end region.

4. The light detecting element according to claim 3, wherein:
the plurality of conductive regions include:
a first conductive region connected to the first light detecting region, the first conductive region being located in the end region and not located in the central region, and
a second conductive region connected to a light detecting region adjacent to the first light detecting region, the second conductive region extending from the central region across to the end region.

5. The light detecting element according to claim 4, wherein:
the plurality of wiring regions further include a third wiring region electrically connected to the light detecting region adjacent to the first light detecting region, and
the second conductive region is connected to a longitudinal edge of the light detecting region adjacent to the first light detecting region and extends in the first direction to the third wiring region.

6. A light emitting device comprising:
a plurality of light emitting elements disposed in a row in a first direction, each having an upper surface, a lower surface, and a lateral surface including an emission end surface from which light is emitted, the plurality of light emitting elements including:
a first light emitting element, which is an outermost one of the light emitting elements at a first end of the row of light emitting elements, wherein the first light emitting element is configured to emit light having a first optical axis, and
a second light emitting element, which is an outermost one of the light emitting elements at a second end of the row of light emitting elements opposite the first end of the row of light emitting elements, wherein the second light emitting element is configured to emit light having a second optical axis;
a light detecting element comprising a light detecting surface, the light detecting surface comprising:
a plurality of light detecting regions disposed in a row in the first direction and irradiated with the light emitted from respective ones of the plurality of light emitting elements, the plurality of light detecting regions including:
a first light detecting region, which is an outermost one of the light detecting regions at a first end of the row of light detecting regions, wherein the first light detecting region is configured to be irradiated with the light emitted from the first light emitting element at a first irradiation point along the first optical axis, and
a second light detecting region, which is an outermost one of the light detecting regions at a second end of the row opposite the first end, wherein the second light detecting region is configured to be irradiated with the light emitted from the second light emitting element at a second irradiation point along the second optical axis, wherein:
each of the plurality of light detecting regions is longer in a second direction than in the first direction, the second direction being perpendicular to the first direction, and
a plurality of light detecting element wiring regions, each of which is an entirety of a region through which current is provided to a respective one of the light detecting regions, the plurality of light detecting element wiring regions including:
a first light detecting element wiring region electrically connected to the first light detecting region, and
a second light detecting element wiring region electrically connected to the second light detecting region;
a base member comprising a plurality of base member wiring regions and on which the plurality of light emitting elements and the light detecting element are disposed; and
a plurality of wires, each having a first end bonded to a respective one of the light detecting element wiring regions and a second end bonded to a respective one of the base member wiring regions, wherein:
in a top view, the first and second light detecting element wiring regions are located in an end region of the light detecting surface located outward of a central region at the light detecting surface, and are not located in the central region, the central region being defined as a region between (i) a straight line extending in the second direction and passing through the first irradiation point and (ii) a straight line extending in the second direction and passing through the second irradiation point.

7. The light emitting device according to claim 6, wherein:
in a top view, the emission end surface of each light emitting element is parallel to the first direction.

8. The light emitting device according to claim 6, wherein:
the light detecting surface is inclined with respect to the optical axis of the light emitted from each light emitting element.

9. The light emitting device according to claim 8, wherein:
the light detecting surface is inclined with respect to the optical axis of the light emitting from each light emitting element at an angle in a range from 40 degrees to 50 degrees.

10. The light emitting device according to claim 6, wherein:
the light detecting element reflects a portion of the light with which each light detecting region is irradiated.

11. The light emitting device according to claim 10, wherein:
no less than 80% of a main portion of the light emitted from the plurality of light emitting elements is emitted upward to an area outside of the light emitting device.

12. The light emitting device according to claim 6, wherein:
each light detecting region has a pair of lateral edges that extend in the first direction and pair of longitudinal edges that are longer than the lateral edges and extend in the second direction, and
at least one of the plurality of base member wiring regions is located between straight lines extending in the first direction on outermost opposite lateral edges of the light detecting regions.

13. The light emitting device according to claim 6, wherein:
the plurality of wires do not pass directly above an upper end of the light detecting element.

14. The light emitting device according to claim 6, comprising:
a lid member bonded to the base member and sealing the plurality of light emitting elements disposed on the base member.

15. The light emitting device according to claim 6, wherein:
the plurality of light emitting elements are disposed on the base member via a submount.

16. The light emitting device according to claim 6, wherein:

the light detecting element is disposed on the base member via a support base.

17. The light emitting device according to claim 6, wherein:
- a length, in the second direction, of the first light detecting region is shorter than a length, in the second direction, of the second light detecting region,
- the first light detecting region is not irradiated with a main portion of light emitted from a light emitting element having a largest vertical spread angle, among the plurality of light emitting elements, and
- the second light detecting region is irradiated the main portion of light emitted from the light emitting element having a largest vertical spread angle, among the plurality of light emitting elements.

18. The light emitting device according to claim 6, wherein:
- each light detecting region has a pair of lateral edges that extend in the first direction and pair of longitudinal edges that are longer than the lateral edges and extend in the second direction, and
- the light detecting surface further comprises a conductive region connected to a light detecting region adjacent to the first light detecting region, the conductive region being located, in a top view, between straight lines extending in the first direction on outermost opposite lateral edges of the light detecting region that is adjacent to the first light detecting region.

* * * * *